(12) United States Patent
Yang et al.

(10) Patent No.: US 10,074,595 B2
(45) Date of Patent: Sep. 11, 2018

(54) SELF-ALIGNMENT FOR REDISTRIBUTION LAYER

(71) Applicant: Taiwan Semiconductor Manufacturing Company, Ltd., Hsinchu (TW)

(72) Inventors: Ku-Feng Yang, Baoshan Township (TW); Ming-Tsu Chung, Hsinchu (TW); Hong-Ye Shih, New Taipei (TW); Jiung Wu, Kueishan Shiang (TW); Chen-Yu Tsai, Zhongli (TW); Hsin-Yu Chen, Taipei (TW); Tsang-Jiuh Wu, Hsinchu (TW); Wen-Chih Chiou, Zhunan Township (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 0 days.

(21) Appl. No.: 15/713,011

(22) Filed: Sep. 22, 2017

(65) Prior Publication Data
US 2018/0012825 A1    Jan. 11, 2018

Related U.S. Application Data

(62) Division of application No. 14/081,969, filed on Nov. 15, 2013, now Pat. No. 9,786,580.

(51) Int. Cl.
*H01L 29/40* (2006.01)
*H01L 23/48* (2006.01)
(Continued)

(52) U.S. Cl.
CPC ...... *H01L 23/481* (2013.01); *H01L 21/76898* (2013.01); *H01L 23/544* (2013.01);
(Continued)

(58) Field of Classification Search
CPC ................. H01L 23/481; H01L 23/544; H01L 21/76898; H01L 21/7684
See application file for complete search history.

(56) References Cited

U.S. PATENT DOCUMENTS

| 7,989,318 B2 | 8/2011 | Yang et al. |
| 8,148,749 B2 | 4/2012 | Grebs et al. |

(Continued)

FOREIGN PATENT DOCUMENTS

| CN | 102386168 A | 3/2012 |
| TW | 201023298 A | 6/2010 |

*Primary Examiner* — Jesse Y Miyoshi
*Assistant Examiner* — Tuan A Hoang
(74) *Attorney, Agent, or Firm* — Slater Matsil, LLP (57) ABSTRACT

An apparatus comprising a substrate with multiple electronic devices. An interconnect structure formed on a first side of the substrate interconnects the electronic devices. Dummy TSVs each extend through the substrate and form an alignment mark on a second side of the substrate. Functional TSVs each extend through the substrate and electrically connect to the electronic devices. A redistribution layer (RDL) formed on the second side of the substrate interconnects ones of the dummy TSVs with ones of the functional TSVs. Step heights of the RDL over the functional TSVs are less than a predetermined value, whereas step heights of the RDL over the dummy TSVs are greater than the predetermined value.

20 Claims, 5 Drawing Sheets

(51) Int. Cl.
*H01L 25/00* (2006.01)
*H01L 23/544* (2006.01)
*H01L 21/768* (2006.01)
*H01L 25/065* (2006.01)
*H01L 23/00* (2006.01)

(52) U.S. Cl.
CPC ............. *H01L 25/50* (2013.01); *H01L 24/05* (2013.01); *H01L 24/13* (2013.01); *H01L 24/81* (2013.01); *H01L 25/0657* (2013.01); *H01L 2223/5442* (2013.01); *H01L 2223/5446* (2013.01); *H01L 2223/54426* (2013.01); *H01L 2224/0401* (2013.01); *H01L 2224/05009* (2013.01); *H01L 2224/05022* (2013.01); *H01L 2224/05124* (2013.01); *H01L 2224/05147* (2013.01); *H01L 2224/05155* (2013.01); *H01L 2224/05166* (2013.01); *H01L 2224/05571* (2013.01); *H01L 2224/06181* (2013.01); *H01L 2224/11* (2013.01); *H01L 2224/1132* (2013.01); *H01L 2224/1134* (2013.01); *H01L 2224/1145* (2013.01); *H01L 2224/11334* (2013.01); *H01L 2224/11462* (2013.01); *H01L 2224/13111* (2013.01); *H01L 2224/13139* (2013.01); *H01L 2224/13147* (2013.01); *H01L 2224/16146* (2013.01); *H01L 2224/17181* (2013.01); *H01L 2224/2919* (2013.01); *H01L 2224/29191* (2013.01); *H01L 2224/32145* (2013.01); *H01L 2224/73204* (2013.01); *H01L 2224/81* (2013.01); *H01L 2224/8113* (2013.01); *H01L 2224/81132* (2013.01); *H01L 2224/81815* (2013.01); *H01L 2224/81895* (2013.01); *H01L 2224/83104* (2013.01); *H01L 2224/92125* (2013.01); *H01L 2224/94* (2013.01); *H01L 2225/06513* (2013.01); *H01L 2225/06541* (2013.01); *H01L 2225/06544* (2013.01); *H01L 2225/06593* (2013.01); *H01L 2924/00012* (2013.01); *H01L 2924/01029* (2013.01); *H01L 2924/01074* (2013.01); *H01L 2924/3512* (2013.01)

(56) References Cited

U.S. PATENT DOCUMENTS

| | | | |
|---|---|---|---|
| 8,709,936 B2* | 4/2014 | Volant | H01L 21/76879 438/614 |
| 2009/0008794 A1 | 1/2009 | Wu et al. | |
| 2012/0056315 A1* | 3/2012 | Chang | H01L 21/6835 257/737 |
| 2012/0119378 A1 | 5/2012 | Ng et al. | |
| 2014/0103520 A1 | 4/2014 | Kirby et al. | |
| 2014/0327105 A1 | 11/2014 | Ramachandran et al. | |
| 2015/0137382 A1 | 5/2015 | Yang et al. | |

* cited by examiner

SELF-ALIGNMENT FOR REDISTRIBUTION LAYER

PRIORITY CLAIM AND CROSS-REFERENCE

This application is a divisional of U.S. patent application Ser. No. 14/081,969, filed on Nov. 15, 2013, entitled "Self-Alignment for Redistribution Layer," which application is hereby incorporated herein by reference in its entirety.

BACKGROUND

Two semiconductor wafers, dies, and/or other substrates may be assembled utilizing through-silicon vias (TSVs) that extend through the thickness of the substrate. The top surface of at least one of the substrates comprises circuitry formed therein and/or thereon, whereas bond pads and a redistribution layer (RDL) are formed on the bottom surface to distribute power and signals to the circuitry through the TSVs.

A conventional RDL may comprise copper with an ENEPIG (electroless nickel—electroless palladium—immersion gold) surface finish. However, as such processing became quite expensive, a proposed alternative entailed incorporating an RDL comprising aluminum instead of copper. Nonetheless, shortcomings also exist with this alternative.

For example, the patterning utilized in forming an RDL comprising aluminum requires additional processes to generate alignment marks utilized during lithography, such as to ensure a certain step height after the TSV formation for alignment marks. However, this step height introduces seam issues in the aluminum film, such as may be attributable to poor step coverage attainable with physical-vapor deposition (PVD) of the aluminum film.

SUMMARY

The present disclosure introduces an apparatus comprising a substrate comprising a plurality of electronic devices. An interconnect structure formed on a first side of the substrate interconnects ones of the plurality of electronic devices. A plurality of dummy TSVs each extend through the substrate and form an alignment mark on a second side of the substrate. A plurality of functional TSVs each extend through the substrate and electrically connect to one of the plurality of electronic devices. A redistribution layer (RDL) formed on the second side of the substrate interconnects ones of the dummy TSVS with ones of the functional TSVs. Step heights of the RDL over the functional TSVs are less than a predetermined value, whereas step heights of the RDL over the dummy TSVs are greater than the predetermined value.

The present disclosure also introduces a method comprising forming a plurality of TSVs each extending from a first surface of a substrate and protruding from a second surface of the substrate, wherein the substrate is defined between the first and second surfaces, and wherein the plurality of TSVs comprises: a plurality of densely located dummy TSVs; and a plurality of spaced apart functional TSVs. A dielectric layer is formed over the second surface of the substrate and ends of each of the plurality of TSVs protruding from the second surface. Planarizing then removes the dielectric layer from over the dummy and functional TSVs, as well as a substantial portion of each of the protruding ends of the functional TSVs. A redistribution layer is then formed over portions of the remaining dielectric layer between ones of the plurality of TSVs, as well as ends of ones of the plurality of TSVs revealed by the planarizing.

The present disclosure also introduces an apparatus comprising a substrate comprising a plurality of electronic devices, and an interconnect structure formed on a first side of the substrate and interconnecting ones of the plurality of electronic devices. A plurality of first through-silicon-vias (TSVs) each extend through the substrate and are electrically connected to one of the plurality of electronic devices within a die area surrounded by a die street. A plurality of second TSVs each extend through the substrate and form an alignment mark within the die street. A redistribution layer (RDL) formed on the second side of the substrate interconnects ones of the pluralities of first and second TSVs.

BRIEF DESCRIPTION OF THE DRAWINGS

The present disclosure is best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Figure 1:
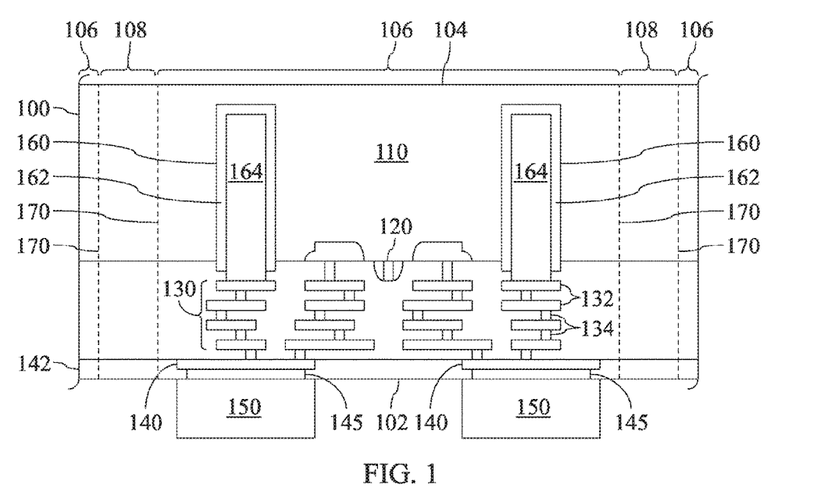
FIG. 1 is a sectional view of at least a portion of apparatus according to one or more aspects of the present disclosure.

FIG. 1 is a cross-sectional view of a first semiconductor wafer 100 having a front side 102 and a back side 104. The first semiconductor wafer 100 comprises multiple semiconductor dies each defined within a corresponding die area 106 demarcated by multiple die streets 108. Each die comprises a substrate 110, one or more active devices 120, an interconnect structure 130, contact pads 140, under-bump metallization (UBM) 145, contact bumps 150, and functional TSVs 160. The substrate 110 may comprise doped or undoped bulk silicon, or an active layer of a silicon-on-insulator (SOI) substrate, such as may comprise a layer of a semiconductor material (e.g., silicon, germanium, silicon germanium, and/or others) on an insulator layer. The substrate 110 may also comprise one or more multi-layered substrates, gradient substrates, or hybrid orientation substrates, among others.

The active devices 120 are represented on FIG. 1 as a single transistor. However, a wide variety of transistors, capacitors, resistors, inductors, and/or other active devices may be utilized to generate the desired structural and functional requirements of the design. The active devices 120 may be formed by any suitable methods, whether within and/or on the surface of the substrate 110.

The functional TSVs 160 may be formed by applying and developing a suitable photoresist (not shown), and then etching the substrate 110 to generate TSV openings. Such openings may extend into the substrate 110 at least further than the active devices 120, perhaps to a depth at least greater than the eventual desired height of the finished semiconductor die. While the depth is dependent upon the overall design of the semiconductor die, the depth may range between about 1 microns and about 700 microns below the surface of the substrate 110, such as to a depth of about 50 microns. The openings for the functional TSVs 160 may have a diameter ranging between about 1 micron and about 100 microns, such as a diameter of about 12 microns.

The openings for the functional TSVs 160 may be filled with a barrier layer 162 and a conductive material 164. The barrier layer 162 may comprise one or more layers of conductive and/or dielectric materials, such as titanium, titanium nitride, tantalum nitride, titanium, silicon nitride, silicon oxide, and/or other materials, which may be formed utilizing chemical-vapor deposition (CVD), plasma-enhanced CVD (PECVD), metal organic CVD (MOCVD), sputtering, and/or other processes. The conductive material 164 may comprise copper, aluminum, doped polysilicon, combinations thereof, and/or other materials, and may be formed by depositing a seed layer and then electroplating copper onto the seed layer. Grinding, chemical mechanical planarizing (CMP), and/or other processes may then be utilized to remove a portion of the barrier layer 162 and/or the conductive material 164.

The interconnect structure 130 comprises multiple metallization layers 132 and vias 134 connecting the various active devices 120 to form functional circuitry. The metallization layers 132 and vias 134 may be formed in alternating layers of dielectric and conductive material by any suitable processing, such as may comprise deposition, damascene, dual damascene, and/or other processes. The interconnect structure 130 may comprise at least four metallization layers 132, which may be separated from the substrate 110 by at least one interlayer dielectric layer (ILD), although the precise number of metallization layers 132 may vary dependent upon the design of the semiconductor die.

The contact pads 140 may connect the interconnect structure 130 to exterior input/output connections, such as the UBM 145. The contact pads 140 may comprise aluminum, copper, alloys and/or combinations of these, and/or other materials, and may be formed in a variety of methods depending upon, for example, the selected composition. For example, patterning a layer of aluminum utilizing photolithography, chemical etching, and/or other techniques may form aluminum contact pads 140. Alternatively, copper contact pads 140 may be formed in openings in a dielectric layer 142 by depositing one or more barrier and/or seed layers (not shown) in the openings, filling the openings with copper, and then planarizing.

The UBMs 145 may act as an intermediary between the contact pads 140 and the contact bumps 150. The UBMs 145 may comprise a series of conforming layers of conductive materials, such as a series of chrome, chrome-copper alloy, copper, and perhaps gold layers, a series of titanium, titanium tungsten, and copper layers, and/or a series of copper, nickel, and gold layers, among other examples. Each such layer may be formed utilizing CVD, PECVD, sputtering, evaporation, plating, and/or other processes, perhaps to a thickness ranging between about 10 microns and about 100 microns, such as to a thickness of about 45 microns. One or more portions of such layers may then be removed by photolithographic masking and etching processes, among others, leaving the patterned UBMs 107.

The contact bumps 150 may comprise tin, silver, copper, and/or other materials. For example, tin solder contact bumps 150 may be formed by initially forming a layer of tin through evaporation, electroplating, printing, solder transfer, ball placement, and/or other processing, followed by one or more reflow processes. The contact bumps 150 may have a thickness of about 100 microns. In some embodiments, the contact bumps 150 are copper pillar bumps which may be formed by photolithography and electro plating processes.

Scribe lines 170 define the borders between the die streets 108 and the die areas 106. The die streets 108 are "formed" by not forming functional structures (such as active devices 120) between the scribe lines 170 on opposing sides of each die street 108. Other structures are formed in the die streets 108, however, such as test pads, dummy metals utilized for planarization, the dummy TSVs 210 described below, and/or other features that are not needed for the functioning of the semiconductor dies 106 once the semiconductor dies 106 have been cut from the first semiconductor wafer 100. The die streets 108 may have a width ranging between about 20 microns and about 180 microns, such as a width of about 80 microns.

A person having ordinary skill in the art will readily recognize that the above description is merely illustrative and should not be viewed as limiting the scope of the present disclosure to just the embodiment shown in FIG. 1. Numerous variations in the initial structure of the semiconductor die in each die area 106 may also or alternatively be utilized. For example, other structures within the scope of the present disclosure may include those in which the functional TSVs 160 extend not only through the substrate 110, but are also formed to extend through one or more of the metallization layers 132.

Figure 2:
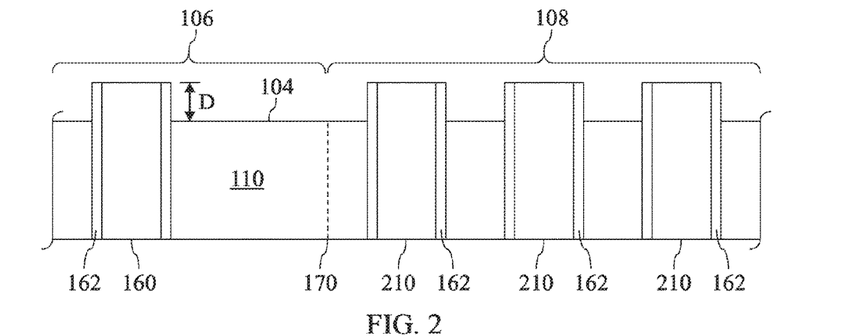
FIG. 2 is a sectional view of the apparatus shown in FIG. 1 in a subsequent stage of manufacture according to one or more aspects of the present disclosure.

FIG. 2 is a cross-sectional view of a portion of the apparatus shown in FIG. 1 in a subsequent stage of manufacture, in which the first semiconductor wafer 100 has been thinned to expose the functional TSVs 160, and also to expose dummy TSVs 210 that were formed in the die streets 108 simultaneously with the formation of functional TSVs 160. Such thinning may entail a multi-step, wet-etch process, such as may comprise one or more bulk removal etching processes and/or one or more finishing etching processes. The one or more bulk removal etching processes may utilize a mixture of one or more of nitric acid (e.g., $HNO_3$), sulfuric acid ($H_2SO_4$), hydrogen fluoride (HF), and phosphoric acid ($H_3PO_4$), among others, and may be performed to remove a bulk portion of the first semiconductor wafer/substrate 100/110 down to the functional TSVs 160 and the dummy TSVs 210. For example, where the substrate 110 has a thickness of about 700 microns, the bulk thinning may remove between about 600 microns and about 670 microns of the substrate 110, such as about 650 microns of the substrate 110, although other removal thicknesses are also within the scope of the present disclosure. One or more subsequent over-etch processes may then remove a portion of the barrier layer(s) 162 and perhaps portions of protruding ends of the functional TSVs 160 and the dummy TSVs 210. Such over-etching may utilize an etchant such as tetramethylammonium n-hydroxide (TMAH) and/or other etchants having a high selectivity between the material of the substrate 110 (e.g., silicon) and the conductive material 164 of the functional TSVs 160 and the dummy TSVs 210 (e.g., copper). Such over-etching may remove the material of the substrate 110 such that the functional TSVs 160 and the dummy TSVs 210 protrude from the substrate 110 a distance D, which may range between about 0.5 microns and about 10 microns, such as about 1 micron, although other protrusion distances are also within the scope of the present disclosure.

Figure 3:
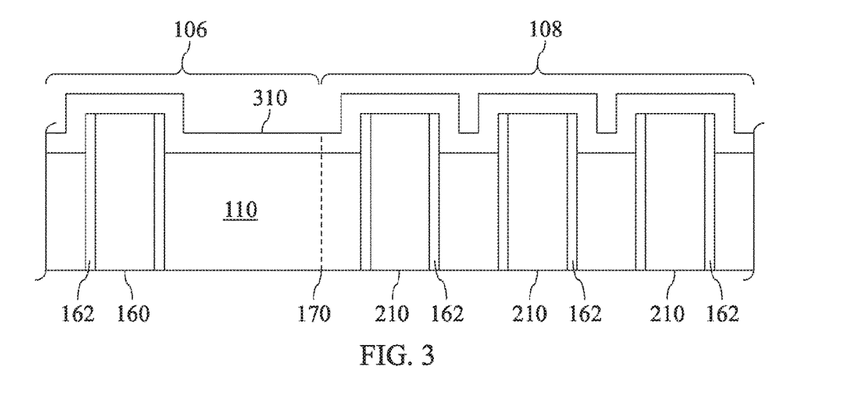
FIG. 3 is a sectional view of the apparatus shown in FIG. 2 in a subsequent stage of manufacture according to one or more aspects of the present disclosure.

FIG. 3 is a sectional view of the apparatus shown in FIG. 2 in a subsequent stage of manufacture in which an insulating layer 310 has been formed over the back side 104, as well as the protruding ends of the functional TSVs 160 and the dummy TSVs 210. The insulating layer 310 may comprise one or more layers of dielectric materials, such as silicon nitride, silicon oxide, and/or other materials, which may be formed utilizing CVD, PECVD, MOCVD, PVD, sputtering, and/or other processes. The insulating layer 310 may have a thickness ranging between about 10 microns and about 100 microns, such as a thickness of about 45 microns.

Figure 4:
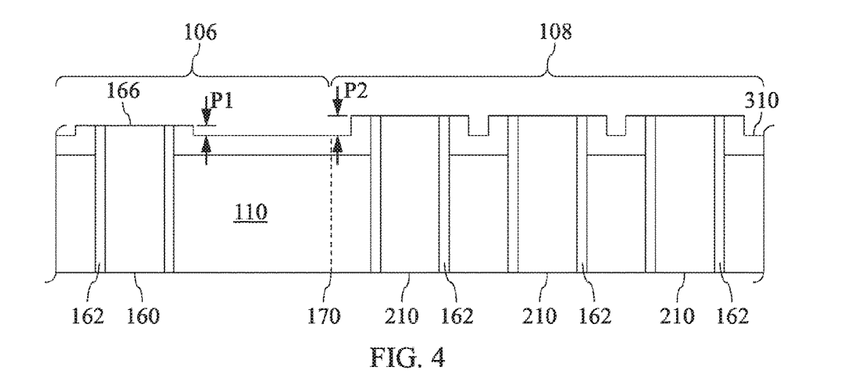
FIG. 4 is a sectional view of the apparatus shown in FIG. 3 in a subsequent stage of manufacture according to one or more aspects of the present disclosure.

FIG. 4 is a sectional view of the apparatus shown in FIG. 3 in a subsequent stage of manufacture in which one or more CMP and/or other planarizing processes have been performed to remove portions of the insulating layer 310 from over the protruding ends of the functional TSVs 160 and the dummy TSVs 210. The planarizing may be performed long enough so that the top surface 166 of the functional TSV 160 is substantially level with or protrudes from surrounding surfaces (e.g., of layer 310) by a distance P1, which may range between 0 and about 1000 Angstroms. However, perhaps as a result of the number density of the dummy TSVs 210, the dummy TSVs 210 may protrude from surrounding surfaces (along with portions of the insulating layer 310) by a distance P2, which may range between about 1000 Angstroms and about 4000 Angstroms.

Figure 5:
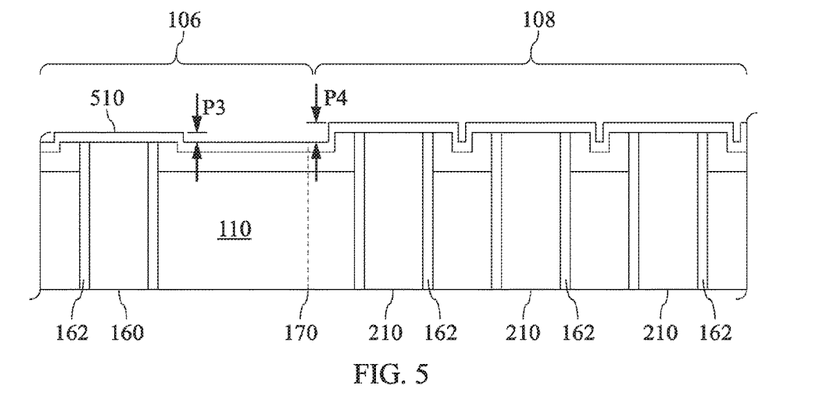
FIG. 5 is a sectional view of the apparatus shown in FIG. 4 in a subsequent stage of manufacture according to one or more aspects of the present disclosure.

FIG. 5 is a sectional view of the apparatus shown in FIG. 4 in a subsequent stage of manufacture in which a redistribution layer (RDL) 510 has been formed over the insulating layer 310, the functional TSVs 160, and the dummy TSVs 210. The RDL 510 may comprise one or more layers of conductive materials, such as aluminum, gold, silver, titanium, titanium nitride, tantalum nitride, titanium, and/or other materials, which may be formed utilizing CVD, PECVD, MOCVD, PVD, sputtering, and/or other processes. The RDL 510 may have a thickness ranging between about 10 microns and about 100 microns, such as a thickness of about 45 microns. As a result, a step height P3 of the RDL 510 over the functional TSV 166 may range between 0 and about 1000 Angstroms, whereas a step height P4 of the RDL 510 over the dummy TSVs 210 may range between about 1000 Angstroms and about 4000 Angstroms.

Figure 6:
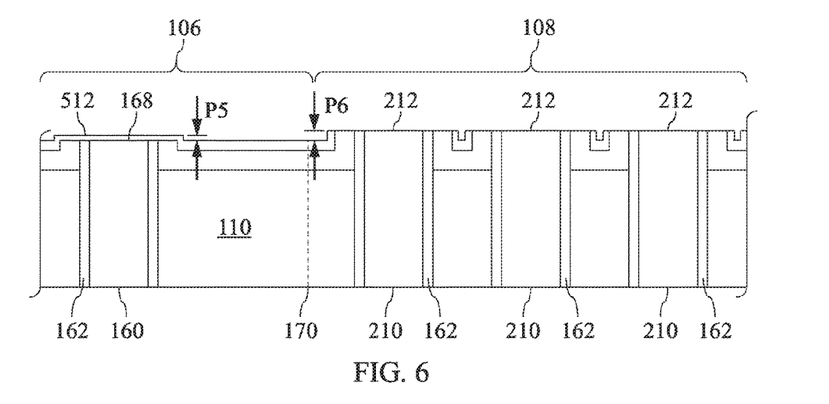
FIG. 6 is a sectional view of the apparatus shown in FIG. 5 in a subsequent stage of manufacture according to one or more aspects of the present disclosure.

FIG. 6 is a sectional view of the apparatus shown in FIG. 5 in a subsequent stage of manufacture in which one or more CMP and/or other planarizing processes have been performed to remove portions of the RDL 510 from over the dummy TSVs 210 and at least partially remove the RDL 510 from over the functional TSVs 160. For example, planarizing may be performed so that a top surface 512 of the RDL 510 over the functional TSV 160 protrudes from surrounding surfaces (e.g., of RDL 510) to a step height P5, or so that the top surface 168 of the functional TSV 160 is exposed and is substantially level with or protrudes from surrounding surfaces (e.g., of RDL 510) to the step height P5. The step height P5 may range between 0 and about 1000 Angstroms. Top surfaces 212 of the dummy TSVs 210 may simultaneously be exposed, and may protrude from surrounding surfaces (along with portions of the insulating layer 310 and/or redistribution layer 510) to a step height P6, which may range between about 1000 Angstroms and about 4000 Angstroms.

For example, the step heights P5 over the functional TSVs may be less than a predetermined value, and the step heights P6 over the dummy TSVs may be greater than the predetermined value. The predetermined value may be about 1000 Angstroms, although others are also within the scope of the present disclosure. In some implementations, the step heights P5 may be less than about 700 Angstroms and the step heights P6 may be greater than about 3000 Angstroms.

Some or all of the step heights P5 may each be a height difference between a planarized portion 512 of the RDL 510 and an un-planarized portion of the RDL 510. Some or all of step heights P5 may alternatively be a height difference between a portion of the RDL 510 and the exposed end 168 of one or more of the functional TSVs 160. The step heights P6 may each be a height difference between a portion of the RDL and the exposed ends 212 of one or more of the dummy TSVs 210.

Figure 7:
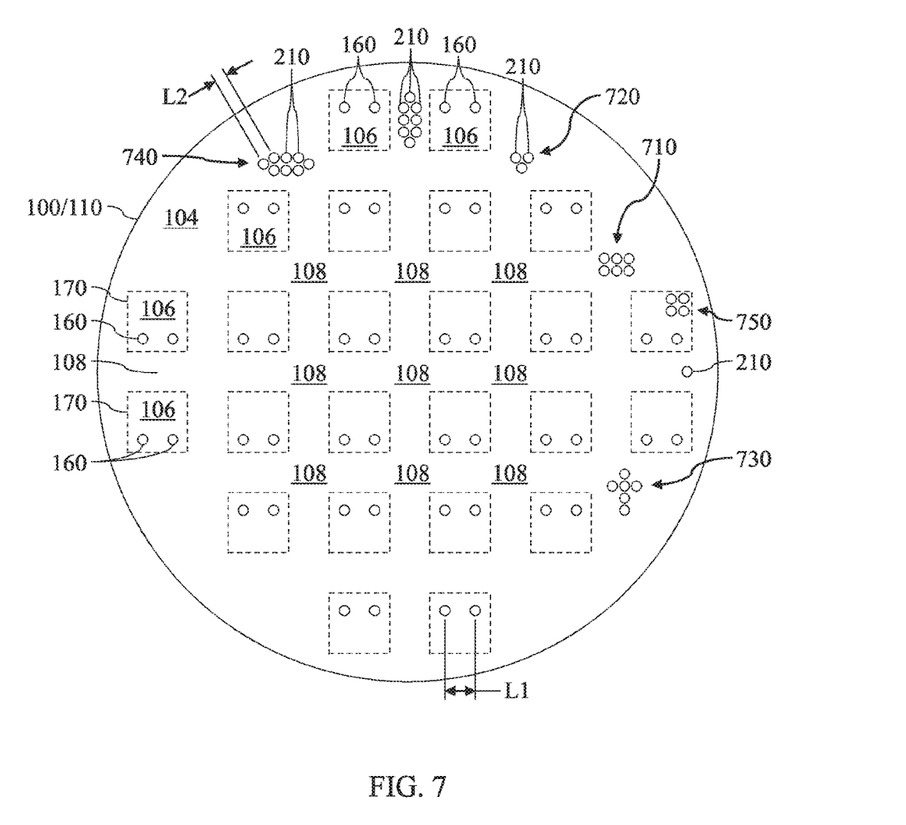
FIG. 7 is a plan view of the apparatus shown in FIG. 6 according to one or more aspects of the present disclosure.

FIG. 7 is a plan view of the backside 104 of the apparatus shown in FIG. 6, demonstrating how the functional TSVs 160 are located within die areas 106 while the dummy TSVs 210 are located within the die streets 108. As also depicted in FIG. 7, the dummy TSVs 210 may be grouped for usage as alignment marks during manufacturing, such as a rectangular alignment mark 710, a triangular alignment mark 720, and/or a cross-shaped alignment mark 730, as well as other alignment marks 740 that may have a shape representing a combination of these and other basic geometric shapes.

One or more functional TSVs 160 and one or more dummy TSVs 210 may collectively be located within a die area 106 surrounded by a die street 108. One such example depicted in FIG. 7 comprises a rectangular alignment mark 750 formed by the dummy TSVs. In other implementations, each of the functional TSVs 160 may be located within the die areas 106 and each of the dummy TSVs 210 may be located within the die street 108. In other implementations, each of the functional TSVs 160 may be located within the die areas 106, a first subset of the dummy TSVs 210 may be located within one or more of the die areas 106, and a second subset of the dummy TSVs 210 may be located within one or more of the die streets 108.

As also shown in FIG. 7, the number/area or "density" of the dummy TSVs 210 may be substantially greater than the density of the functional TSVs 160. Thus, the dummy TSVs 210 may be located densely, and the functional TSVs 160 may be located spaced apart.

For example, a closest two of the functional TSVs 160 may be laterally offset by a first distance L1, and a closest two of the dummy TSVs 210 may be laterally offset by a second distance L2. The first distance L1 may be at least twice, triple, or quadruple the second distance L2, if not more. The first distance L1 may be at least about 100 microns, and the second distance L2 may be less than about 30 microns. In such implementations, and others within the present scope, the functional TSVs 160 and the dummy TSVs 210 may have a diameter ranging between about 10 microns and about 15 microns, such as about 12 microns.

Figure 8:
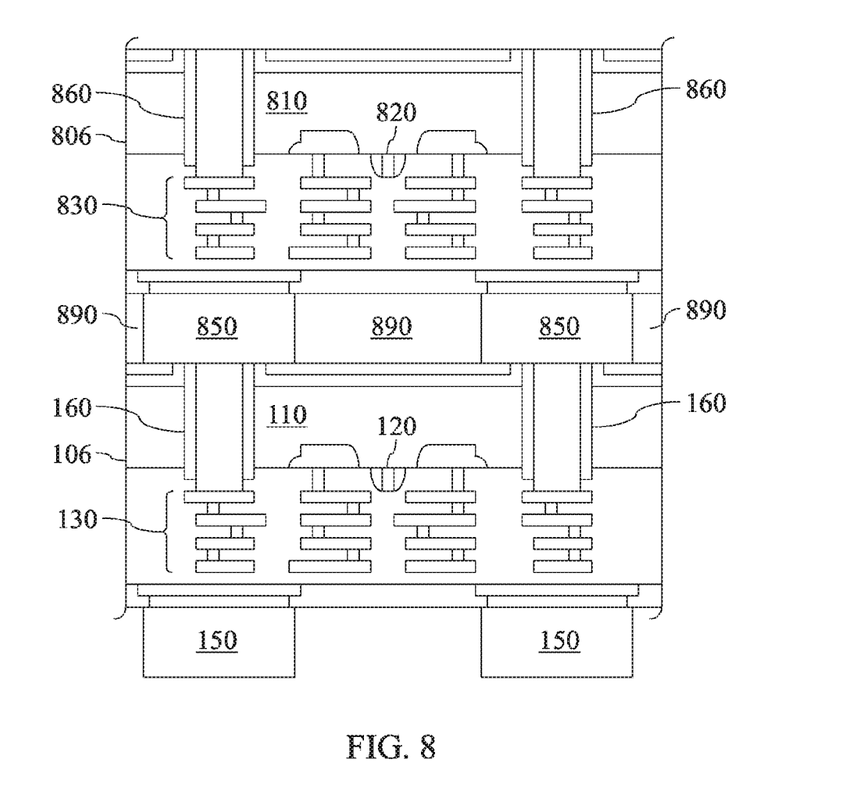
FIG. 8 is a sectional view of the apparatus shown in FIG. 6 in a subsequent stage of manufacture according to one or more aspects of the present disclosure.

FIG. 8 is a sectional view of the apparatus shown in FIG. 6 in a subsequent stage of manufacture in which a second semiconductor die 806 has been bonded to the first semiconductor die 106. The second semiconductor die 806 may comprise structures similar to the first semiconductor die 106, such as a second substrate 810, a second set of active devices 820, a second interconnect structure 830, and second contact bumps 850, some or all of which may be formed in a similar fashion as described above with respect to FIG. 1. However, the second semiconductor die 806 is not intended to be limited to the example depicted in FIG. 8, and any suitable device may alternatively be connected to the first semiconductor die 106. Assembling the second semiconductor die 806 to the first semiconductor die 106 may utilize the above-described dummy TSVs 210 and/or one or more of the alignment marks 710, 720, 730, and 740 (not shown in FIG. 8 for purposes of clarity).

Bonding the first semiconductor die 106 to the second semiconductor die 806 may comprise aligning the second contact bumps 850 with the functional TSVs 160 of the first semiconductor die 106, perhaps utilizing one or more of the alignment marks depicted in FIG. 7. Once aligned, the second contact bumps 850 and the functional TSVs 160 may be bonded together by contacting the second contact bumps 850 to the functional TSVs 160 and performing a reflow to reflow the material of the second contact bumps 850 and bond to the functional TSVs 160. However, copper-copper bonding and/or one or more other bonding methods may alternatively or additionally be utilized to bond the second semiconductor die 806 to the first semiconductor die 106.

An underfill material 890 may be injected or otherwise formed in the space between the two dies 106 and 806. The underfill material 890 may be or comprise a liquid epoxy, for example, which may be dispensed between the two dies 106 and 806 and then cured to harden. The underfill material 890 may aid in preventing cracks from forming in the contact bumps 850, such as may otherwise be caused by thermal and/or other stresses. A deformable gel and/or silicon rubber may also or alternatively be formed between the two dies 106 and 806. A saw blade and/or other means may then be utilized to slice the dies 106 and 806 along the die streets, although other singulation processes may also or alternatively be performed.

According to an embodiment, a method includes forming a functional through via (TV) within a die area of a substrate, the functional TV having a first protruding portion extending above a first surface of the substrate by a first height. An alignment mark is formed within a die street region of the substrate, the die street region of the substrate surrounding the die area of the substrate, the alignment mark including a dummy TV, the dummy TV having a second protruding portion extending above the first surface of the substrate by a second height, the second height being equal to the first height. The first height of the first protruding portion of the functional TV is reduced by a first amount. The second height of the second protruding portion of the dummy TV is reduced by a second amount, the second amount being less than the first amount.

According to another embodiment, a method includes forming a functional through via (TV) within a die area of a substrate. A dummy TV is formed within a die street region of the substrate, the die street region of the substrate surrounding the die area of the substrate. A first surface of the substrate is recessed to expose a first portion of the functional TV and a second portion of the dummy TV, the first portion of the functional TV and the second portion of the dummy TV having a same height. The first portion of the functional TV is shortened, a shortened first portion of the functional TV having a first height. The second portion of the dummy TV is shortened, a shortened second portion of the dummy TV having a second height, the second height being greater than the first height.

According to yet another embodiment, a method includes forming a plurality of through-silicon-vias (TSVs) each extending from a first surface of a substrate and protruding from a second surface of the substrate, the first surface being opposite the second surface, where the substrate includes a die area and a die street region surrounding the die area, and where the plurality of TSVs includes dummy TSVs within the die street region, and functional TSVs within the die area. The method further includes forming a dielectric layer over the second surface of the substrate and protruding ends of each of the dummy and functional TSVs protruding from the second surface. The method further includes planarizing to remove portions of the dielectric layer from over the dummy and functional TSVs, and a portion of each of the protruding ends of the functional TSVs, where the protruding ends of dummy TSVs have a first height after the planarizing, and where the protruding ends of the functional TSVs have a second height after the planarizing, the first height being greater than the second height.

The foregoing outlines features of several embodiments so that a person having ordinary skill in the art may better understand the aspects of the present disclosure. A person having ordinary skill in the art should appreciate that they may readily use the present disclosure as a basis for designing or modifying other processes and structures for carrying out the same purposes and/or achieving the same advantages of the embodiments introduced herein. A person having ordinary skill in the art should also realize that such equivalent constructions do not depart from the spirit and scope of the present disclosure, and that they may make various changes, substitutions and alterations herein without departing from the spirit and scope of the present disclosure.

What is claimed is:
1. A method comprising:
   forming a functional through via (TV) within a die area of a substrate, the functional TV having a first protruding portion extending above a first surface of the substrate by a first height;
   forming an alignment mark within a die street region of the substrate, the die street region of the substrate surrounding the die area of the substrate, the alignment mark comprising a dummy TV, the dummy TV having a second protruding portion extending above the first surface of the substrate by a second height, the second height being equal to the first height;
   reducing the first height of the first protruding portion of the functional TV by a first amount; and reducing the second height of the second protruding portion of the dummy TV by a second amount, the second amount being less than the first amount.

2. The method of claim 1, further comprising:
before reducing the first height of the first protruding portion of the functional TV and the second height of the second protruding portion of the dummy TV, forming a dielectric layer over the first surface of the substrate, the first protruding portion of the functional TV and the second protruding portion of the dummy TV; and
before reducing the first height of the first protruding portion of the functional TV and the second height of the second protruding portion of the dummy TV, removing portions of the dielectric layer to expose the first protruding portion of the functional TV and the second protruding portion of the dummy TV.

3. The method of claim 2, wherein a thickness of the dielectric layer is between about 10 μm and about 100 μm.

4. The method of claim 1, further comprising, after reducing the first height of the first protruding portion of the functional TV and the second height of the second protruding portion of the dummy TV, forming a redistribution layer over the functional TV.

5. The method of claim 1, wherein the first height is between about 0.5 μm and about 10 μm.

6. The method of claim 1, wherein a diameter of the functional TV is between about 10 μm and about 15 μm.

7. The method of claim 1, wherein a diameter of the dummy TV is between about 10 μm and about 15 μm.

8. A method comprising:
forming a functional through via (TV) within a die area of a substrate;
forming a dummy TV within a die street region of the substrate, the die street region of the substrate surrounding the die area of the substrate;
recessing a first surface of the substrate to expose a first portion of the functional TV and a second portion of the dummy TV, the first portion of the functional TV and the second portion of the dummy TV having a same height;
shortening the first portion of the functional TV, a shortened first portion of the functional TV having a first height; and
shortening the second portion of the dummy TV, a shortened second portion of the dummy TV having a second height, the second height being greater than the first height.

9. The method of claim 8, further comprising:
before shortening the first portion of the functional TV and the second portion of the dummy TV, forming a dielectric layer over the first surface of the substrate, the first portion of the functional TV and the second portion of the dummy TV; and
before shortening the first portion of the functional TV and the second portion of the dummy TV, removing portions of the dielectric layer to expose a first top surface of the portion of the functional TV and a second top surface of the second portion of the dummy TV.

10. The method of claim 8, forming a redistribution layer over the shortened first portion of the functional TV.

11. The method of claim 10, wherein the redistribution layer has a thickness between about 10 μm and about 100 μm.

12. The method of claim 8, wherein recessing the first surface of the substrate comprises removing a portion of the substrate, the portion of the substrate having a thickness between about 600 μm and about 670 μm.

13. The method of claim 8, wherein recessing the first surface of the substrate comprises performing one or more etching processes on the substrate.

14. The method of claim 8, wherein shortening the first portion of the functional TV and the second portion of the dummy TV comprises planarizing the first portion of the functional TV and the second portion of the dummy TV.

15. A method comprising:
forming a plurality of through-silicon-vias (TSVs) each extending from a first surface of a substrate and protruding from a second surface of the substrate, the first surface being opposite the second surface, wherein the substrate comprises a die area and a die street region surrounding the die area, and wherein the plurality of TSVs comprises:
dummy TSVs within the die street region; and
functional TSVs within the die area;
forming a dielectric layer over the second surface of the substrate and protruding ends of each of the dummy and functional TSVs protruding from the second surface; and
planarizing to remove:
portions of the dielectric layer from over the dummy and functional TSVs; and
a portion of each of the protruding ends of the functional TSVs, wherein the protruding ends of dummy TSVs have a first height after the planarizing, and wherein the protruding ends of the functional TSVs have a second height after the planarizing, the first height being greater than the second height.

16. The method of claim 15, further comprising, after the planarizing, forming a redistribution layer over the functional TSVs and between adjacent ones of the dummy TSVs.

17. The method of claim 15, wherein planarizing to remove the portion of each of the protruding ends of the functional TSVs comprises:
planarizing to shorten the protruding ends of the functional TSVs to less than a predetermined height; and
planarizing to shorten the protruding ends of the dummy TSVs to greater than the predetermined height.

18. The method of claim 15, wherein the functional TSVs have a first pitch and the dummy TSVs have a second pitch, the first pitch being greater than the second pitch.

19. The method of claim 18, wherein the first pitch is at least twice the second pitch.

20. The method of claim 15, wherein the plurality of TSVs have a diameter between about 10 μm and about 15 μm.

* * * * *